(12) United States Patent
Gao et al.

(10) Patent No.: US 10,204,797 B1
(45) Date of Patent: Feb. 12, 2019

(54) METHODS, APPARATUS, AND SYSTEM FOR REDUCING STEP HEIGHT DIFFERENCE IN SEMICONDUCTOR DEVICES

(71) Applicant: GLOBALFOUNDRIES INC., Grand Cayman (KY)

(72) Inventors: Jinsheng Gao, Clifton Park, NY (US); Daniel Jaeger, Saratoga Springs, NY (US); Michael Aquilino, Gansevoort, NY (US); Patrick Carpenter, Saratoga Springs, NY (US); Junsic Hong, Malta, NY (US); Jessica Dechene, Watervliet, NY (US); Haigou Huang, Rexford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/890,210

(22) Filed: Feb. 6, 2018

(51) Int. Cl.
| | |
|---|---|
| *H01L 21/00* | (2006.01) |
| *H01L 21/3105* | (2006.01) |
| *H01L 21/02* | (2006.01) |
| *C23C 16/36* | (2006.01) |
| *H01L 21/67* | (2006.01) |
| *C23C 16/56* | (2006.01) |
| *C23C 16/26* | (2006.01) |

(52) U.S. Cl.
CPC ........ *H01L 21/31056* (2013.01); *C23C 16/26* (2013.01); *C23C 16/36* (2013.01); *C23C 16/56* (2013.01); *H01L 21/022* (2013.01); *H01L 21/02115* (2013.01); *H01L 21/02126* (2013.01); *H01L 21/02167* (2013.01); *H01L 21/67063* (2013.01)

(58) Field of Classification Search
CPC ............ H01L 21/31056; H01L 21/022; H01L 21/02115; H01L 21/02126; H01L 21/67063; H01L 21/02167
See application file for complete search history.

(56) References Cited

U.S. PATENT DOCUMENTS

| | | | |
|---|---|---|---|
| 6,287,990 B1 * | 9/2001 | Cheung | C23C 16/401 257/E21.279 |
| 2010/0248471 A1 * | 9/2010 | Nam | H01L 21/0337 438/618 |
| 2015/0091127 A1 * | 4/2015 | Lee | H01L 29/0649 257/506 |

* cited by examiner

*Primary Examiner* — Richard A Booth
(74) *Attorney, Agent, or Firm* — Williams Morgan, P.C.

(57) ABSTRACT

The disclosed methods may include depositing an amorphous carbon layer, a SiCN layer, and a TEOS layer; planarizing the semiconductor structure; performing a non-selective etch to remove the SiCN layer, the TEOS layer, and a portion of the amorphous carbon layer; and performing a selective etch of the amorphous carbon layer. The methods may reduce step height differences between first and second regions of the semiconductor structure.

20 Claims, 6 Drawing Sheets

METHODS, APPARATUS, AND SYSTEM FOR REDUCING STEP HEIGHT DIFFERENCE IN SEMICONDUCTOR DEVICES

BACKGROUND OF THE INVENTION

Field of the Invention

Generally, the present disclosure relates to the manufacture of sophisticated semiconductor devices, and, more specifically, to various methods and systems for reduce step height differences in semiconductor devices.

Description of the Related Art

The technology explosion in the manufacturing industry has resulted in many new and innovative manufacturing processes. Today's manufacturing processes, particularly semiconductor manufacturing processes, call for a large number of significant steps. These process steps usually require a number of inputs that are generally fine-tuned to maintain proper manufacturing control.

The manufacture of semiconductor devices requires a number of discrete process steps to create a packaged semiconductor device from raw semiconductor material. Generally, a set of processing steps are performed on a group of semiconductor wafers, sometimes referred to as a lot, using semiconductor-manufacturing tools, such as an exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one region on the semiconductor wafer to another. In this manner, integrated circuit chips may be fabricated.

A number of process steps desired for use in the manufacture of semiconductor devices require a flat or planar surface. An exemplary such process is chamfering. This desire is opposed by the countervailing desire to maximize the density of desired semiconductor device features, such as fins or gates, on a semiconductor device by building such features vertically. As a result, adjacent regions of a semiconductor device, such as a first region comprising gates and a second region lacking raised features, may have a step height difference and, hence, are incompatible with process steps that require a flat or planar surface.

The present disclosure may address and/or at least reduce one or more of the problems identified above.

Accordingly, it would be desirable to reduce step height differences between adjacent regions of a semiconductor structure, to allow process steps that require a flat or planar surface, such as chamfering, to be performed during manufacture of the semiconductor structure.

SUMMARY OF THE INVENTION

The following presents a simplified summary of the disclosure in order to provide a basic understanding of some aspects of the disclosure. This summary is not an exhaustive overview of the disclosure. It is not intended to identify key or critical elements of the disclosure or to delineate the scope of the disclosure. Its sole purpose is to present some concepts in a simplified form as a prelude to the more detailed description that is discussed later.

Generally, the present disclosure is directed to a method, comprising depositing an amorphous carbon layer over a semiconductor structure, wherein the semiconductor structure comprises a first region having a first height and a second region having a second height; depositing a silicon carbon nitride (SiCN) layer over the amorphous carbon layer; depositing a tetraethylorthosilicate (TEOS) layer over the SiCN layer; planarizing the semiconductor structure, wherein a first portion of the TEOS layer over the first region is removed and a second portion of the TEOS layer over the second region is retained; performing a non-selective etch, wherein the second portion of the TEOS layer, the SiCN layer, and an upper portion of the amorphous carbon layer are removed and a lower portion of the amorphous carbon layer is retained; and performing a selective etch of the amorphous carbon layer, wherein the lower portion of the amorphous carbon layer is removed from the first region and an upper surface of the lower portion of the amorphous carbon layer in the second region has a height of about the first height.

The present disclosure also includes a semiconductor device manufacturing system adapted to implement one or more steps of the method.

The present disclosure may reduce step height differences between adjacent regions of a semiconductor structure, to allow process steps that require a flat or planar surface, such as chamfering, to be performed during manufacture of the semiconductor structure.

BRIEF DESCRIPTION OF THE DRAWINGS

The disclosure may be understood by reference to the following description taken in conjunction with the accompanying drawings, in which like reference numerals identify like elements, and in which.

Figure 1:
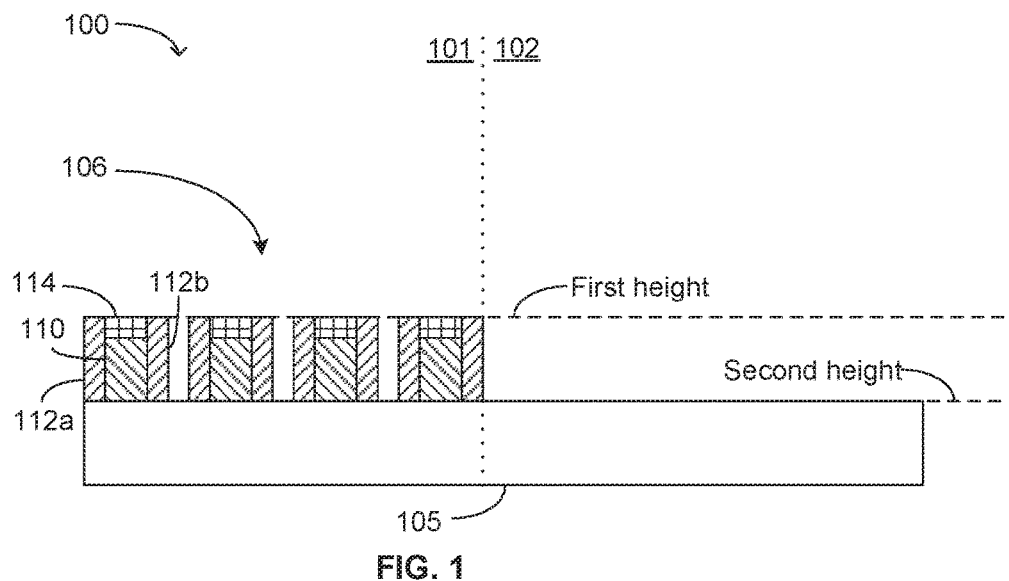
FIG. 1 illustrates a stylized depiction of a semiconductor structure, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the disclosure to the particular forms disclosed, but on the contrary, the intention is to cover all modifications, equivalents, and alternatives falling within the spirit and scope of the disclosure as defined by the appended claims.

DETAILED DESCRIPTION

Various illustrative embodiments of the disclosure are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein are directed to methods of reducing step height differences in semiconductor structures during manufacture of such devices, as well as manufacturing systems adapted to implement one or more elements of such methods. Embodiments herein provide reducing step height differences between adjacent regions of a semiconductor structure, which may allow process steps that require a flat or planar surface (e.g., chamfering) to be performed during manufacture of the semiconductor structure.

Turning to FIG. 1, a stylized depiction of a semiconductor structure 100 that may be used as a starting point for one or more methods disclosed herein is depicted. The semiconductor structure 100 comprises two regions: a first region 101 to the left of the vertical dotted line; and a second region 102 to the right of the vertical dotted line. The first region 101 may comprise one or more features formed on a substrate 105. The substrate 105 may be formed from silicon, silicon germanium, or the like.

In the embodiment depicted in FIG. 1, the first region comprises a plurality of gates 106 formed by a poly open process. Each gate 106 comprises a gate electrode 110, a left spacer 112a, a right spacer 112b, and a cap 114. The top portions of each of the plurality of gates 106 are essentially coplanar, and define a first height of the first region 101. The second region 102 lacks features formed thereon. Accordingly, the top of the substrate 105 defines a second height of the second region 102. In one embodiment (not shown), the first region 101 may comprise replacement metal gates by a middle of line process.

Generally, the method disclosed herein may be performed on any semiconductor structure having a step height difference, for which it may be desired to reduce the step height difference.

Figure 2:
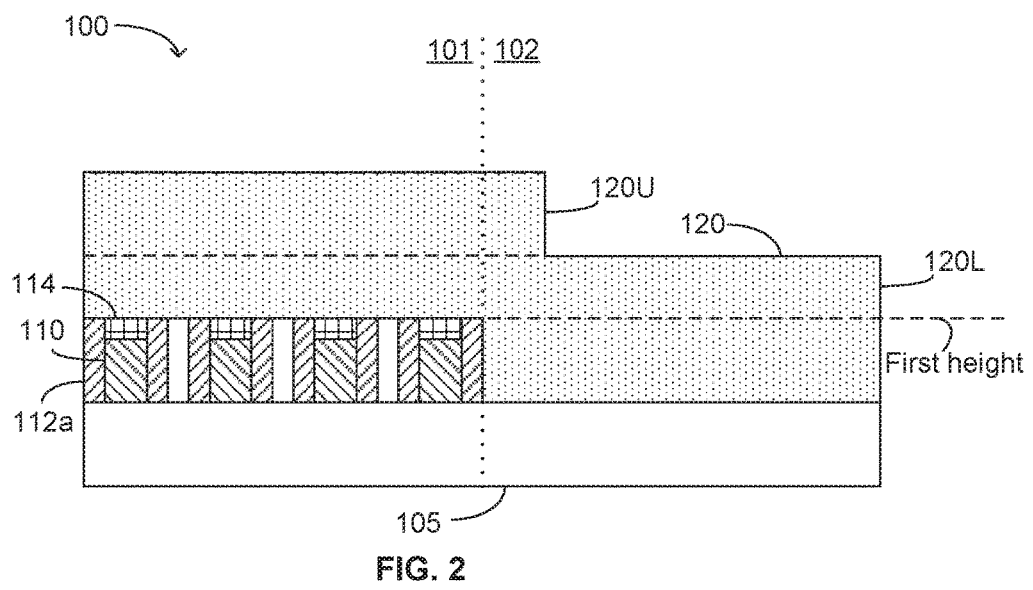
FIG. 2 illustrates a stylized depiction of a semiconductor structure after depositing an amorphous carbon layer, in accordance with embodiments herein.

FIG. 2 shows stylized depiction of the semiconductor structure 100 after depositing an amorphous carbon layer 120 over the semiconductor structure 100. Generally, if the gaps between features (e.g., gates 106) formed in the first region 101 are sufficiently narrow, the amorphous carbon layer 120 will not be deposited between the features, as shown. In other embodiments (not shown), the amorphous carbon layer 120 may be deposited between the features in the first region 101. The amorphous carbon layer 120 may comprise an upper portion 120U and a lower portion 120L.

Depositing the amorphous carbon layer 120 may be performed using techniques known to the person of ordinary skill in the art. In one embodiment, the amorphous carbon layer 120 may be deposited to a thickness of about 1500 nm to about 6000 nm. For example, the amorphous carbon layer 120 may be deposited to a thickness of about 3000 nm to about 4000 nm.

Figure 3:
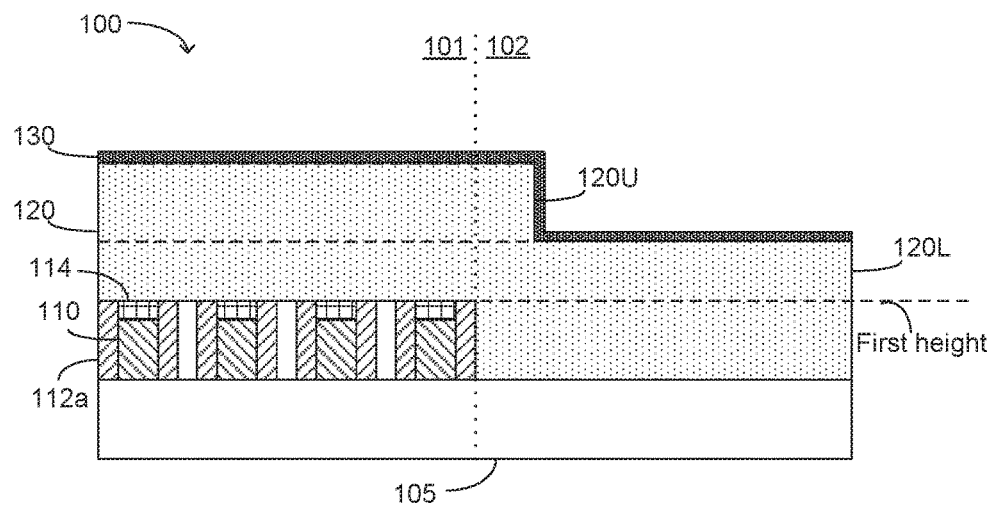
FIG. 3 illustrates a stylized depiction of a semiconductor structure after depositing an SiCN layer, in accordance with embodiments herein.

FIG. 3 shows a stylized depiction of the semiconductor structure 100 after depositing a silicon carbon nitride (SiCN) layer 130 over the amorphous carbon layer 120. Depositing the SiCN layer 130 may be performed using any technique known to the person of ordinary skill in the art. In one embodiment, the SiCN layer 130 may be deposited to a thickness of about 100 nm to about 200 nm. For example, the SiCN layer 130 may be deposited to a thickness of about 150 nm.

Figure 4:
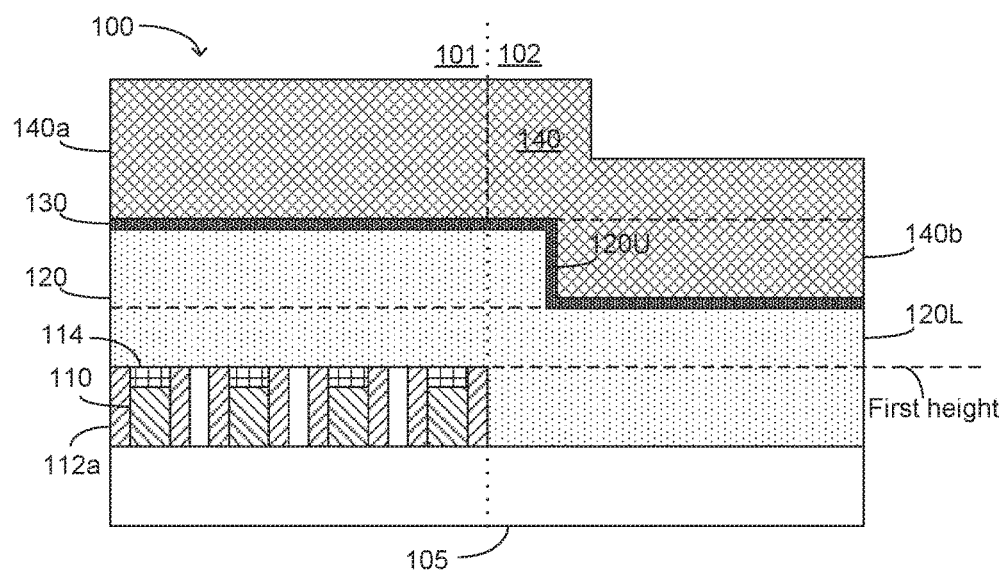
FIG. 4 illustrates a stylized depiction of a semiconductor structure after depositing a TEOS layer, in accordance with embodiments herein.

FIG. 4 shows a stylized depiction of the semiconductor structure 100 after depositing a tetraethylorthosilicate (TEOS) layer 140 over the SiCN layer 130. As depicted, the TEOS layer 140 may comprise a first portion 140a over the first region 101 and a second portion 140b over the second region 102.

Depositing the TEOS layer may 140 be performed using any technique known to the person of ordinary skill in the art. In one embodiment, the TEOS layer 140 may be deposited to a thickness of from about 2000 nm to about 6000 nm. For example, the TEOS layer 140 may be deposited to a thickness of about 4000 nm. As is understood in the semiconductor arts, TEOS deposition is generally followed by conversion of the TEOS to oxide(s) of silicon.

Figure 5:
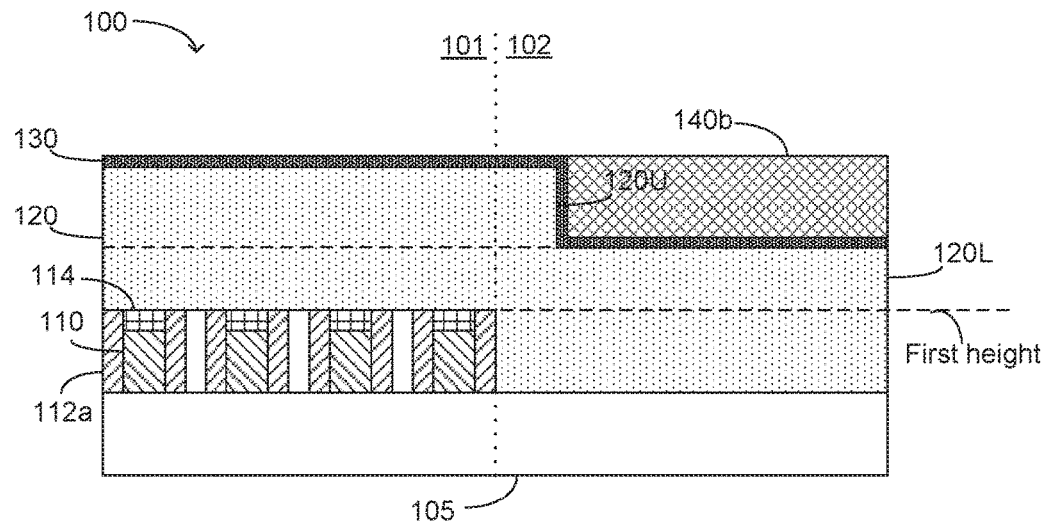
FIG. 5 illustrates a stylized depiction of a semiconductor structure after planarizing, in accordance with embodiments herein.

FIG. 5 shows the semiconductor structure 100 after planarizing, wherein the first portion 140a of the TEOS layer 140 over the first region 101 is removed and the second portion 140b of the TEOS layer 140 over the second region 102 is retained. Planarizing may be performed by any known technique, such as chemical-mechanical polishing (CMP). The SiCN layer 130 may function as a stop layer for planarizing.

Figure 6:
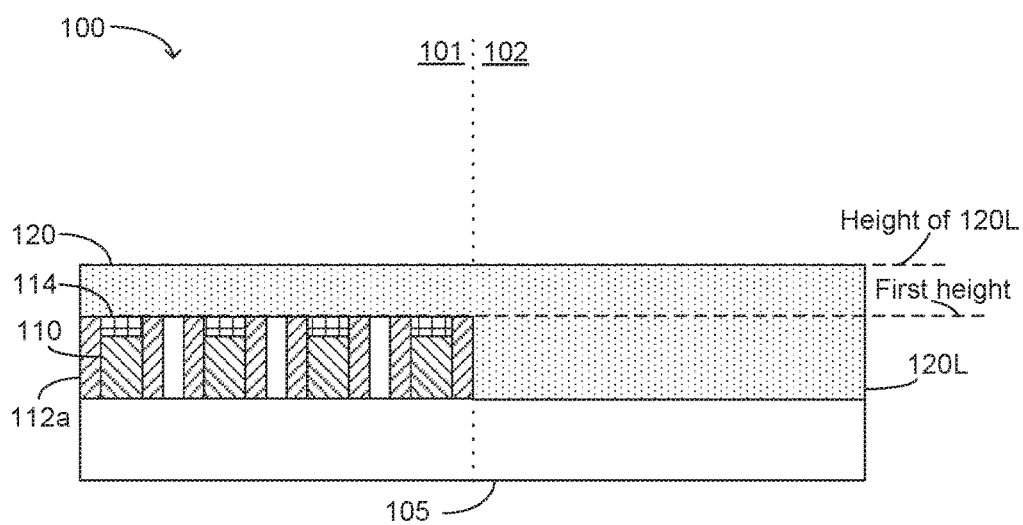
FIG. 6 illustrates a stylized depiction of a semiconductor structure after performing a non-selective etch, in accordance with embodiments herein.

FIG. 6 shows the semiconductor structure 100 after performing a non-selective etch (NSE) process, wherein the second portion 140b of the TEOS layer 140, the SiCN layer 130, and the upper portion 120U of the amorphous carbon layer 120 are removed and the lower portion 120L of the amorphous carbon layer 120 is retained. By "non-selective etch" is meant an etch technique which etches all three of TEOS, SiCN, and amorphous carbon at essentially the same rate.

In one embodiment, the non-selective etch process comprises a temperature equal to or greater than 50° C.; a flow rate of $CF_4$ from about 40 sccm (standard cubic centimeters per minute) to about 60 sccm; a flow rate of He from about 80 sccm to about 120 sccm; and a flow rate of $N_2$ from about 80 sccm to about 120 sccm. In a further embodiment, the temperature is about 60° C., and the ratio of the flow rate of $CF_4$:the flow rate of He:the flow rate of $N_2$ is about 1:2:2.

In one particular embodiment, the non-selective etch comprises the following parameters:

| TCP(w) | Bias(V) | P(mT) | temp | $CF_4$(sccm) | He(sccm) | $N_2$(sccm) |
|---|---|---|---|---|---|---|
| 330 | 470 | 4 | 60 | 50 | 100 | 100 |

By way of example only, these parameters yielded the following etch rates of amorphous carbon, SiCN, and silicon oxide:

| Amorphous Carbon Etch Rate (nm/min) | SiCN Etch Rate (nm/min) | SiO Etch Rate (nm/min) |
|---|---|---|
| 46.6 | 51.6 | 52.8 |

Although described herein in the context of FIGS. 1-6, a non-selective etch may be performed on any semiconductor structure comprising an amorphous carbon layer, a SiCN layer, and a TEOS layer.

Figure 7:
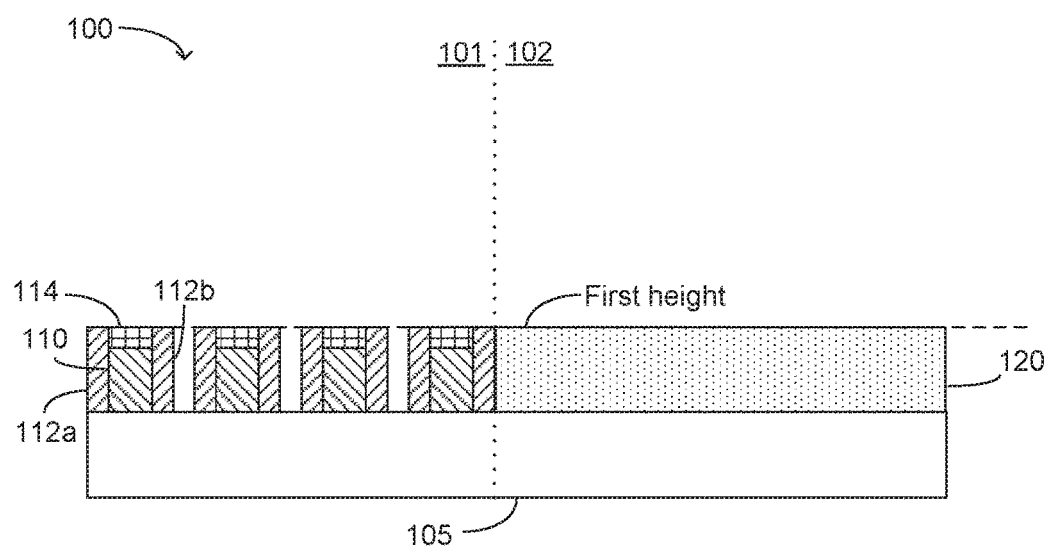
FIG. 7 illustrates a semiconductor structure after a selective etch, in accordance with embodiments herein.

FIG. 7 shows a stylized depiction of the semiconductor structure 100 after performing a selective etch of the amorphous carbon layer 120. The lower portion 120L of the amorphous carbon layer 120 is removed from the first region 101 and an upper surface of the lower portion 120L of the amorphous carbon layer 120 in the second region 102 has a height of about the first height.

The selective etch of the amorphous carbon layer 120 may be performed using any technique known to the person of ordinary skill in the art. In one embodiment, the selective etch may be performed for a duration from about 0.5 sec per the difference between the height of the lower portion 120L of the amorphous carbon layer 120 and the first height in nanometers to about 2 sec per the difference between the height of the lower portion 120L of the amorphous carbon layer 120 and the first height in nanometers. For example, if height of the lower portion 120L of the amorphous carbon layer 120 is about 320 nm above an upper surface of substrate 105 and the first height is about 140 nm above the upper surface of substrate 105, then the difference is 180 nm the selective etch may be performed for about 90 sec to about 360 sec, such as for about 170 sec.

After performing the selective etch of the amorphous carbon layer 120, the semiconductor structure 100 may be subjected to one or more processes. The semiconductor structure 100 depicted in FIG. 7 may be especially suitable for one or more processes requiring an upper surface of the first region 101 and an upper surface of the second region 102 to be about coplanar. In one embodiment, a process that may be performed on the semiconductor structure 100 depicted in FIG. 7 is chamfering.

Alternatively or in addition, some or all of the remainder of the lower portion 120L of the amorphous carbon layer 120 may be removed from the second region. Removing some or all of the remainder of the lower portion 120L of the amorphous carbon layer 120 can be performed using any technique known to the person of ordinary skill in the art. In one embodiment, a selective etch as described above may be performed. In addition to removing some or all of the remainder of the lower portion 120L of the amorphous carbon layer 120, some or all of any amorphous carbon deposited between features (e.g., gates 106) of the first region 101 may also be removed.

Figure 8:
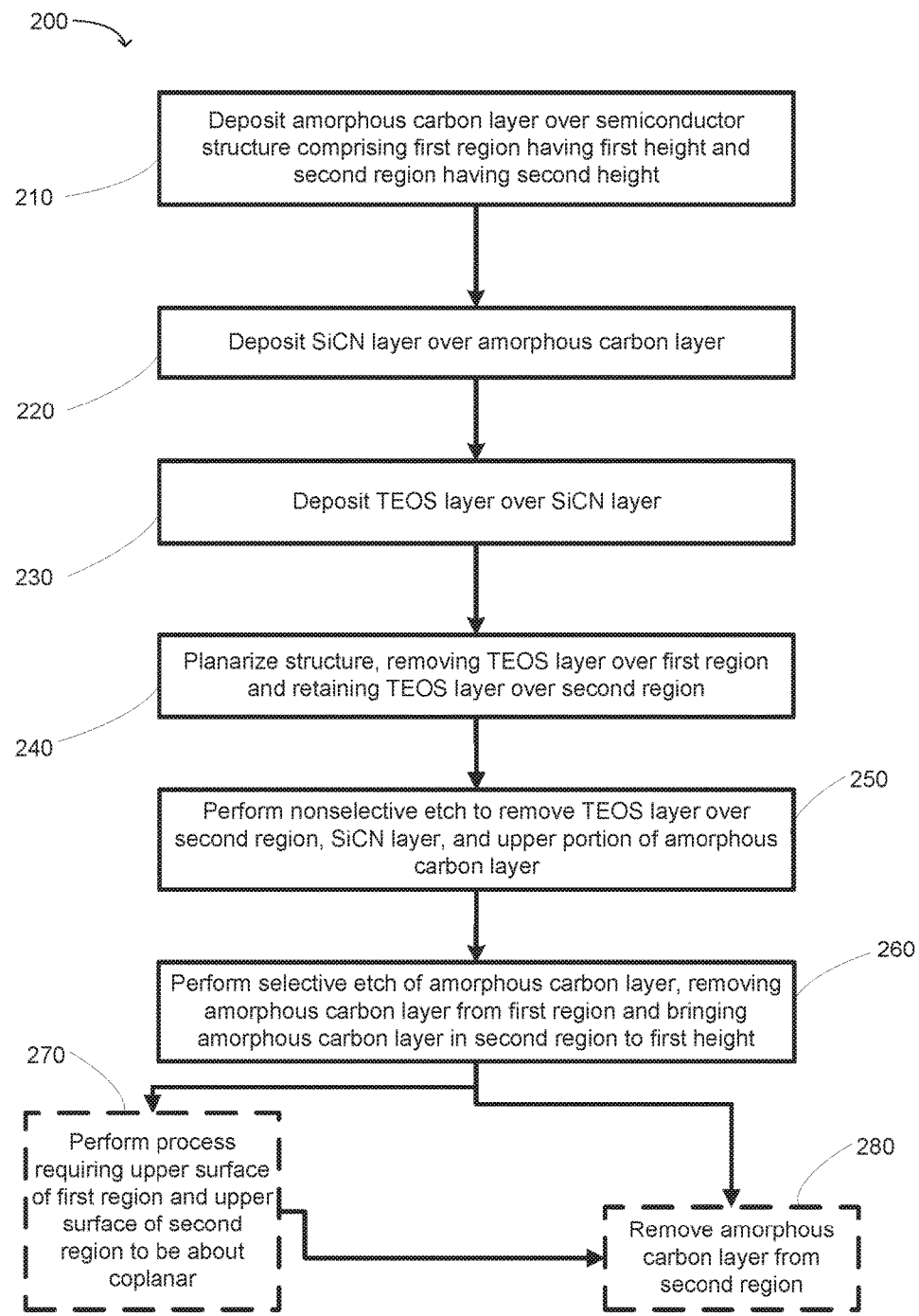
FIG. 8 illustrates a flowchart of a method, in accordance with embodiments herein.

FIG. 8 presents a flowchart of a method 200 in accordance with embodiments herein. The method 200 comprises depositing (at 210) an amorphous carbon layer over a semiconductor structure, wherein the semiconductor structure comprises a first region having a first height and a second region having a second height. In one embodiment, the amorphous carbon layer may be deposited to a thickness of about 1500 nm to about 6000 nm.

The method 200 also comprises depositing (at 220) a silicon carbon nitride (SiCN) layer over the amorphous carbon layer. In one embodiment, the SiCN layer may be deposited to a thickness of about 100 nm to about 200 nm.

Additionally, the method 200 comprises depositing (at 230) a tetraethylorthosilicate (TEOS) layer over the SiCN layer. In one embodiment, the TEOS layer may be deposited to a thickness of from about 2000 nm to about 6000 nm.

The method 200 further comprises planarizing (at 240) the semiconductor structure, wherein a first portion of the TEOS layer over the first region is removed and a second portion of the TEOS layer over the second region is retained. Also, the method 200 comprises performing (at 250) a non-selective etch, wherein the second portion of the TEOS layer, the SiCN layer, and an upper portion of the amorphous carbon layer are removed and a lower portion of the amorphous carbon layer is retained. In one embodiment, the non-selective etch comprises a temperature equal to or greater than 50° C.; a flow rate of $CF_4$ from about 40 sccm to about 60 sccm; a flow rate of He from about 80 sccm to about 120 sccm; and a flow rate of $N_2$ from about 80 sccm to about 120 sccm.

The method 200 yet additionally comprises performing (at 260) a selective etch of the amorphous carbon layer, wherein the lower portion of the amorphous carbon layer is removed from the first region and an upper surface of the lower portion of the amorphous carbon layer in the second region has a height of about the first height. In one embodiment, the selective etch is performed (at 260) for a duration from about 0.5 sec per the difference between the height of the lower portion of the amorphous carbon layer and the first height in nanometers to about 2 sec per the difference between the height of the lower portion of the amorphous carbon layer and the first height in nanometers.

In one embodiment, the method 200 may further comprise performing (at 270) a process on the semiconductor structure after performing the selective etch, wherein the process requires an upper surface of the first region and an upper surface of the second region to be about coplanar. In one embodiment, the process performed at 270 is chamfering.

In one embodiment, the method 200 may further comprise removing (at 280) some or all of the lower portion of the amorphous carbon layer from the second region.

Figure 9:
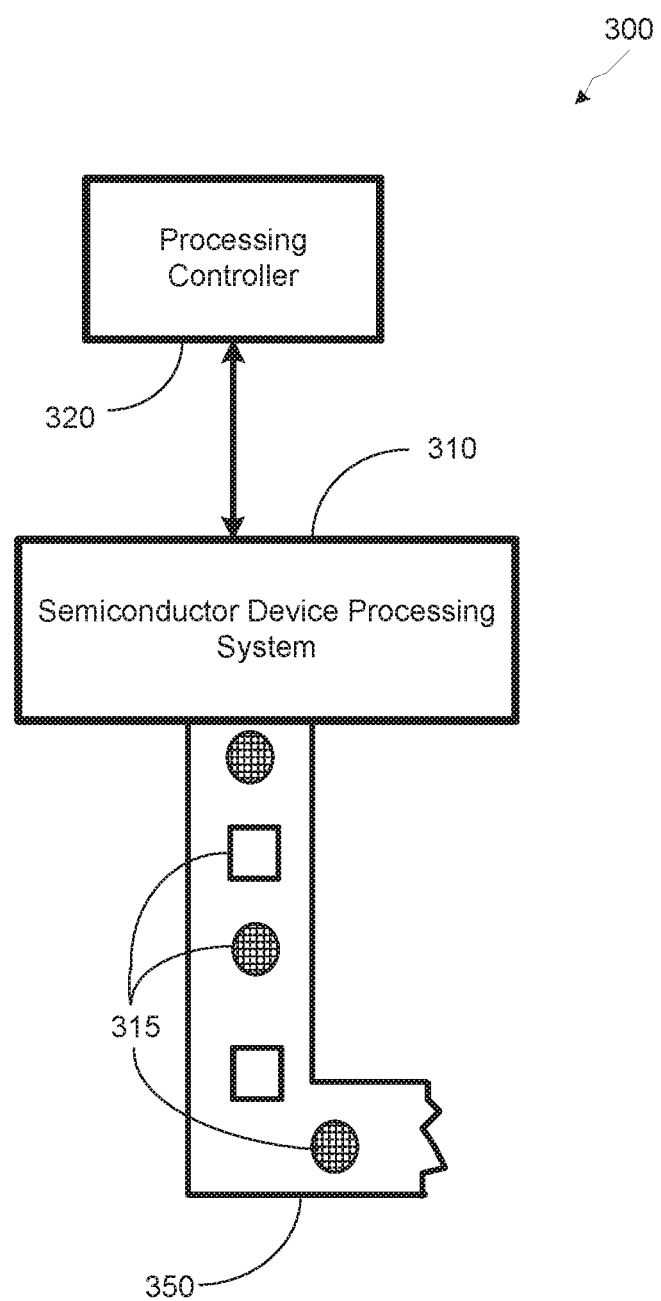
FIG. 9 illustrates a stylized depiction of a system for fabricating a semiconductor device, in accordance with embodiments herein.

Turning now to FIG. 9, a stylized depiction of a system for fabricating a semiconductor device wherein a step height difference between first and second regions, in accordance with embodiments herein, is illustrated. The system 300 is capable of manufacturing semiconductor devices using the process steps described above.

The semiconductor device processing system 310 may comprise various processing stations, such as etch process stations, photolithography process stations, CMP process stations, etc. One or more of the processing steps performed by the processing system 310 may be controlled by the processing controller 320. The processing controller 320 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 310 may produce integrated circuits on a medium, such as silicon wafers. The processing system 310 may provide processed integrated circuits/devices 315 on a transport mechanism 350, such as a conveyor system. In some embodiments, the conveyor system may be sophisticated clean room transport systems that are capable of transporting semiconductor wafers. In one embodiment, the semiconductor device processing system 310 may perform one or more processing steps, e.g., one or more of those described above and depicted in FIG. 8.

In some embodiments, the items labeled "315" may represent individual wafers, and in other embodiments, the items 315 may represent a group of semiconductor wafers, e.g., a "lot" of semiconductor wafers. The integrated circuit or device 315 may comprise a transistor, a capacitor, a resistor, a memory cell, a processor, and/or the like. In one embodiment, the device 315 includes a plurality of transistors.

The system 300 may be capable of performing analysis and manufacturing of various products involving various technologies. For example, the system 300 may use design and production data for manufacturing devices of CMOS technology, Flash technology, BiCMOS technology, power devices, memory devices (e.g., DRAM devices), NAND memory devices, and/or various other semiconductor technologies.

The semiconductor device processing system 310 may be adapted to perform one or more of the following:

deposit an amorphous carbon layer over a semiconductor structure, wherein the semiconductor structure comprises a first region having a first height and a second region having a second height;

deposit a silicon carbon nitride (SiCN) layer over the amorphous carbon layer;

deposit a TEOS layer over the SiCN layer;

planarize the semiconductor structure, wherein a first portion of the TEOS layer over the first region is removed and a second portion of the TEOS layer over the second region is retained;

perform a non-selective etch, wherein the second portion of the TEOS layer, the SiCN layer, and an upper portion of the amorphous carbon layer are removed and a lower portion of the amorphous carbon layer is retained; and perform a selective etch of the amorphous carbon layer, wherein the lower portion of the amorphous carbon layer is removed from the first region and an upper surface of the lower portion of the amorphous carbon layer in the second region has a height of about the first height.

In one embodiment, the semiconductor device processing system 310 may be adapted to deposit the amorphous carbon layer to a thickness of about 1500 nm to about 6000 nm.

In one embodiment, the semiconductor device processing system 310 may be adapted to deposit the SiCN layer to a thickness of about 100 nm to about 200 nm.

In one embodiment, the semiconductor device processing system 310 may be adapted to deposit the TEOS layer to a thickness of from about 2000 nm to about 6000 nm.

In one embodiment, the semiconductor device processing system 310 may be adapted to perform a non-selective etch, wherein the non-selective etch comprises a temperature equal to or greater than 50° C.; a flow rate of $CF_4$ from about 40 sccm to about 60 sccm; a flow rate of He from about 80 sccm to about 120 sccm; and a flow rate of $N_2$ from about 80 sccm to about 120 sccm.

In one embodiment, the semiconductor device processing system 310 may be adapted to perform the selective etch for a duration from about 0.5 sec per the difference between the height of the lower portion of the amorphous carbon layer and the first height in nanometers to about 2 sec per the difference between the height of the lower portion of the amorphous carbon layer and the first height in nanometers.

In one embodiment, the semiconductor device processing system 310 may be further adapted to perform a process on the semiconductor structure after performing the selective etch, wherein the process requires an upper surface of the first region and an upper surface of the second region to be about coplanar. For example, the process requiring an upper surface of the first region and an upper surface of the second region to be about coplanar may be chamfering.

In one embodiment, the semiconductor device processing system 310 may be further adapted to remove the lower portion of the amorphous carbon layer from the second region.

The methods described above may be governed by instructions that are stored in a non-transitory computer readable storage medium and that are executed by, e.g., a processor in a computing device. Each of the operations described herein may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the disclosure may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the disclosure. Accordingly, the protection sought herein is as set forth in the claims below.

What is claimed is:

1. A method, comprising:

depositing an amorphous carbon layer over a semiconductor structure, wherein the semiconductor structure comprises a first region having a first height and a second region having a second height;

depositing a silicon carbon nitride (SiCN) layer over the amorphous carbon layer;

depositing a tetraethylorthosilicate (TEOS) layer over the SiCN layer;

planarizing the semiconductor structure, wherein a first portion of the TEOS layer over the first region is removed and a second portion of the TEOS layer over the second region is retained;

performing a non-selective etch, wherein the second portion of the TEOS layer, the SiCN layer, and an upper portion of the amorphous carbon layer are removed and a lower portion of the amorphous carbon layer is retained; and performing a selective etch of the amorphous carbon layer, wherein the lower portion of the amorphous carbon layer is removed from the first region and an upper surface of the lower portion of the amorphous carbon layer in the second region has a height of about the first height.

2. The method of claim 1, wherein depositing the amorphous carbon layer is to a thickness of about 1500 nm to about 6000 nm.

3. The method of claim 1, wherein depositing the SiCN layer is to a thickness of about 100 nm to about 200 nm.

4. The method of claim 1, wherein depositing the TEOS layer is to a thickness of from about 2000 nm to about 6000 nm.

5. The method of claim 1, wherein the non-selective etch comprises:
a temperature equal to or greater than 50° C.;
a flow rate of $CF_4$ from about 40 sccm to about 60 sccm;
a flow rate of He from about 80 sccm to about 120 sccm; and
a flow rate of $N_2$ from about 80 sccm to about 120 sccm.

6. The method of claim 1, wherein performing the selective etch is for a duration from about 0.5 sec per the difference between the height of the lower portion of the amorphous carbon layer and the first height in nanometers to about 2 sec per the difference between the height of the lower portion of the amorphous carbon layer and the first height in nanometers.

7. The method of claim 1, further comprising performing a process on the semiconductor structure after performing the selective etch, wherein the process requires an upper surface of the first region and an upper surface of the second region to be about coplanar.

8. The method of claim 7, wherein the process is chamfering.

9. The method of claim 1, further comprising removing the lower portion of the amorphous carbon layer from the second region.

10. A method, comprising:
performing a non-selective etch on a semiconductor structure comprising an amorphous carbon layer, a SiCN layer, and a tetraethylorthosilicate (TEOS) layer, wherein the non-selective etch comprises:
a temperature equal to or greater than 50° C.;
a flow rate of $CF_4$ from about 40 sccm to about 60 sccm;
a flow rate of He from about 80 sccm to about 120 sccm; and
a flow rate of $N_2$ from about 80 sccm to about 120 sccm.

11. The method of claim 10, wherein:
the temperature is about 60° C.; and
the ratio of the flow rate of $CF_4$:the flow rate of He:the flow rate of $N_2$ is about 1:2:2.

12. A system, comprising:
a semiconductor device processing system to manufacture a semiconductor device; and
a processing controller operatively coupled to said semiconductor device processing system, said processing controller configured to control an operation of the semiconductor device processing system;
wherein the semiconductor device processing system is adapted to:
deposit an amorphous carbon layer over a semiconductor structure, wherein the semiconductor structure comprises a first region having a first height and a second region having a second height;
deposit a silicon carbon nitride (SiCN) layer over the amorphous carbon layer;
deposit a tetraethylorthosilicate (TEOS) layer over the SiCN layer;
planarize the semiconductor structure, wherein a first portion of the TEOS layer over the first region is removed and a second portion of the TEOS layer over the second region is retained;
perform a non-selective etch, wherein the second portion of the TEOS layer, the SiCN layer, and an upper portion of the amorphous carbon layer are removed and a lower portion of the amorphous carbon layer is retained; and
perform a selective etch of the amorphous carbon layer, wherein the lower portion of the amorphous carbon layer is removed from the first region and an upper surface of the lower portion of the amorphous carbon layer in the second region has a height of about the first height.

13. The system of claim 12, wherein the semiconductor device processing system is adapted to deposit the amorphous carbon layer to a thickness of about 1500 nm to about 6000 nm.

14. The system of claim 12, wherein the semiconductor device processing system is adapted to deposit the SiCN layer to a thickness of about 100 nm to about 200 nm.

15. The system of claim 12, wherein the semiconductor device processing system is adapted to deposit the TEOS layer to a thickness of from about 2000 nm to about 6000 nm.

16. The system of claim 12, wherein the non-selective etch comprises:
a temperature equal to or greater than 50° C.;
a flow rate of $CF_4$ from about 40 sccm to about 60 sccm;
a flow rate of He from about 80 sccm to about 120 sccm; and
a flow rate of $N_2$ from about 80 sccm to about 120 sccm.

17. The system of claim 12, wherein the semiconductor device processing system is adapted to perform the selective etch is for a duration from about 0.5 sec per the difference between the height of the lower portion of the amorphous carbon layer and the first height in nanometers to about 2 sec per the difference between the height of the lower portion of the amorphous carbon layer and the first height in nanometers.

18. The system of claim 12, wherein the semiconductor device processing system is further adapted to perform a process on the semiconductor structure after performing the selective etch, wherein the process requires an upper surface of the first region and an upper surface of the second region to be about coplanar.

19. The system of claim 18, wherein the process is chamfering.

20. The system of claim 12, wherein the semiconductor device processing system is further adapted to remove the lower portion of the amorphous carbon layer from the second region.

* * * * *